United States Patent [19]

Moraveji et al.

[11] Patent Number: 5,510,754

[45] Date of Patent: Apr. 23, 1996

[54] FAST SLEWING AMPLIFIER USING DYNAMIC CURRENT MIRRORS

[75] Inventors: Farhood Moraveji, San Jose; Mahmud F. Musbah, Santa Clara, both of Calif.

[73] Assignee: National Semiconductor Corporation, Santa Clara, Calif.

[21] Appl. No.: 341,818

[22] Filed: Nov. 18, 1994

[51] Int. Cl.$^6$ ........................................................ H03F 3/30
[52] U.S. Cl. ............................................. 330/267; 330/263
[58] Field of Search ......................................... 330/255, 257, 330/263, 265, 267

[56] References Cited

U.S. PATENT DOCUMENTS

| | | | |
|---|---|---|---|
| 3,815,037 | 6/1974 | Wheatley, Jr. | 330/257 X |
| 4,791,383 | 12/1988 | Monticelli et al. | 330/265 |
| 4,827,223 | 5/1989 | Gross | 330/267 |
| 4,833,424 | 5/1989 | Wright | 330/267 |
| 4,894,622 | 1/1990 | Buitendijk | 330/307 |
| 4,970,470 | 11/1990 | Gosser | 330/255 X |
| 5,049,653 | 9/1991 | Smith et al. | 330/267 |
| 5,150,074 | 9/1992 | Gosser | 330/263 |
| 5,218,321 | 6/1993 | Jost | 330/267 |
| 5,323,122 | 6/1994 | Bowers | 330/267 |
| 5,339,042 | 8/1994 | Kaire et al. | 330/261 |

FOREIGN PATENT DOCUMENTS

| | | | |
|---|---|---|---|
| 1160530 | 6/1985 | U.S.S.R. | 330/255 |
| 1160530A | 6/1985 | U.S.S.R. | 330/255 |
| 1192111A | 11/1985 | U.S.S.R. | 330/263 |
| 1254579 | 8/1986 | U.S.S.R. | 330/267 |

OTHER PUBLICATIONS

U.S. pending patent application Ser. No.: 08/340,556, filed Nov. 16, 1994, Title: Amplifier Stage Having Compensation for NPN, PNP Beta Mismatch and Improved Slew, Attorney Docket No. NS–2605 US.

U.S. pending patent application Ser. No.: 08/362,030, filed Dec. 22 1994, Title: Triple Buffered Amplifier Output Stage, Attorney Docket No. NS–2607 US.

*Primary Examiner*—James B Mullins
*Attorney, Agent, or Firm*—Skjerven, Morrill, MacPherson, Franklin & Friel; Norman R. Klivans

[57] ABSTRACT

An amplifier input stage solves the problem of response to large signal (slewing) conditions being limited by the amplifier being dependent on constant current to charge capacitances at certain nodes in the amplifier. In general, in order to achieve faster slewing one must undesirably provide more quiescent current. Instead, by providing dynamic current sources for driving transistors in the amplifier input stage, a low level of quiescent current is maintained while a high output level of current is provided during slewing. This allows rapid charging/discharging of the capacitances at nodes in the amplifier signal path, while conserving power.

11 Claims, 7 Drawing Sheets

FAST SLEWING AMPLIFIER USING DYNAMIC CURRENT MIRRORS

BACKGROUND OF THE INVENTION

1. Field of the Invention

This invention relates to amplifiers and more specifically to an amplifier input stage.

2. Description of Related Art

The amplifier shown in FIG. 1a operates as illustrated in FIG. 1b, showing the input buffer portion of FIG. 1a with the associated current flows. At a balanced condition, i.e. no input signal, ideally there is no current through resistor $R_E$. If a signal amplitude at the +IN terminal increases (rises) by a value $\Delta V_{in}$ the current through transistor Q5 decreases by $\Delta i$, as does the current through transistor Q2. At the same time, the current through transistors Q4 and Q6 increases by $\Delta i$. Thus the current through resistor $R_E$ is equal to $2\Delta i= \Delta V_{in}/R_E$. Note that the gain of the input buffer shown in FIG. 1b is $g_m=1/R_E$. Current $\Delta i$ also appears through resistors R1 and R2 in FIG. 1a.

Thus a net current $2\Delta i$ (see FIG. 1a) charges the capacitances C1 and C2 at high impedance gain node G. Under large signal conditions the change in voltage at the high impedance gain node G (which is also the input terminal of the amplifier output stage here designated OP) is dependent on how fast the voltage changes at the emitters of transistors Q9 and Q12.

The current provided to the emitters of respectively transistors Q9 and Q12 is relevant to charging and discharging capacitances C1 and C2 (which include both the compensation capacitors and the parasitic capacitances at point G), because the maximum sourcing current at the collector of transistor Q10 is equal to the β of transistor Q10 times current $I_O$ from current source I5. Similarly, the maximum sinking current at the collector of transistor Q11 is equal to the β of transistor Q11 times the current $I_O$ from current source I6.

Therefore in order to achieve a higher slewing rate, i.e. a fast response of the output signal to a fast changing positive going or negative going input signal, one must provide more current. This requires increasing the current sourcing/sinking capabilities of current sources I5 and I6, which disadvantageously requires a larger device area and also involves consuming higher idling power, due to the higher quiescent current.

Thus the technical problem is that it is difficult to respond quickly to such a high slew rate signal in an amplifier of the type of FIG. 1a without undesirably providing a high quiescent current to the base terminals of the transistors Q10 and Q11. Such high quiescent current is undesirable both because of the need to provide large size devices to drive such a current and because a high current means high power dissipation.

SUMMARY OF THE INVENTION

In accordance with the invention, instead of using constant current sources to drive the control terminals (bases) of the output transistors in an amplifier stage, dynamic current sources are used. Thus in the idle (quiescent) state, i.e. with no signal slewing, the level of current provided is low. However when a positive or negative going slew is present, the level of current sourced and sunk to/from the output transistors is increased in response. Thus both the charging and discharging, i.e. sourcing and sinking current level, for the capacitance present at the emitter nodes of transistors Q9 and Q12 in FIG. 1a is made dynamic.

In one embodiment the dynamic current is provided by a dynamic current source having an output terminal connected to the base (control terminal) of a transistor in an output gain stage of the amplifier input stage (e.g., the base of transistor Q10 in FIG. 1) and a control terminal connected to an output terminal (collector or second current handling terminal) of one of the transistors in for instance the inverting input buffer. Similarly a second dynamic current source has its output terminal connected to the base of transistor Q11 and a control terminal connected to an output terminal of one of the transistors in the inverting input buffer.

More generally any dynamic current source which is responsive to a change in the input signal amplitude may be used in accordance with the invention to provide a dynamic current to drive a buffer in the amplifier. (It is to be understood that in the amplifier of FIG. 1a, transistors Q9 and Q12 form a first gain stage and transistors Q10 and Q11 form a second gain stage.) The dynamic current sources may each be a current mirror or other type of current source which is responsive to a control signal. In the case of use of a current mirror, a conventional current mirror, a conventional Wilson current mirror, or a modified Wilson current mirror may be used as described in further detail below.

One type of simple conventional current mirror used in accordance with the invention includes a transistor having its control terminal (the base for a bipolar transistor) connected to an output terminal of one of the transistors in an input buffer of the amplifier, and having its output terminal connected to the emitter of one of the transistors in an output gain stage of the input stage. Also a diode is connected between the base of the current mirror transistor and a voltage source. Thus a current which mirrors a level of a signal output by the input buffer is provided to drive a transistor in the output gain stage. This mirror current dynamically drives the output gain stage in accordance with the level of the input signal.

DETAILED DESCRIPTION OF THE INVENTION

Figure 1A:
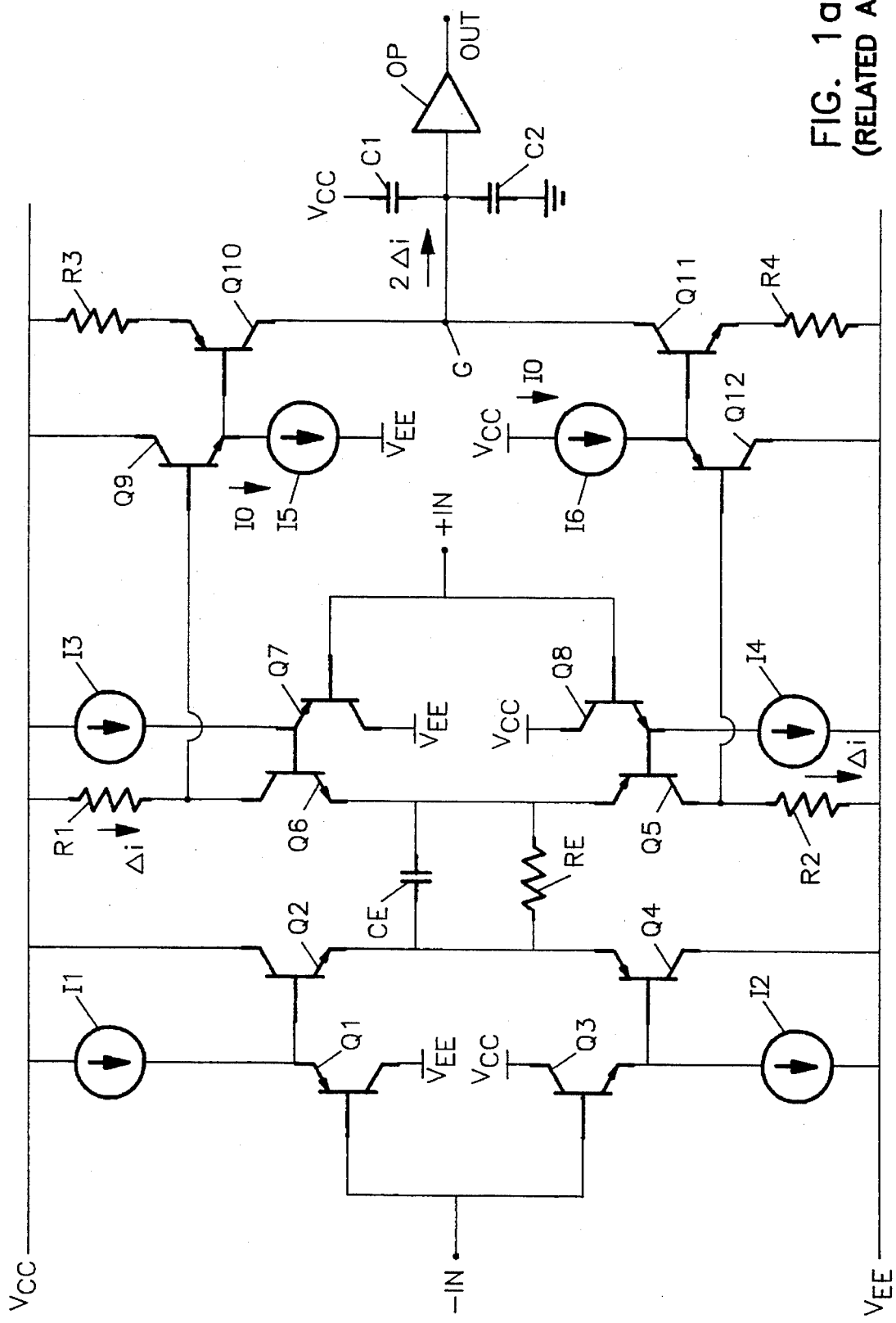
FIG. 1a shows an amplifier having constant current sources.
Figure 1B:
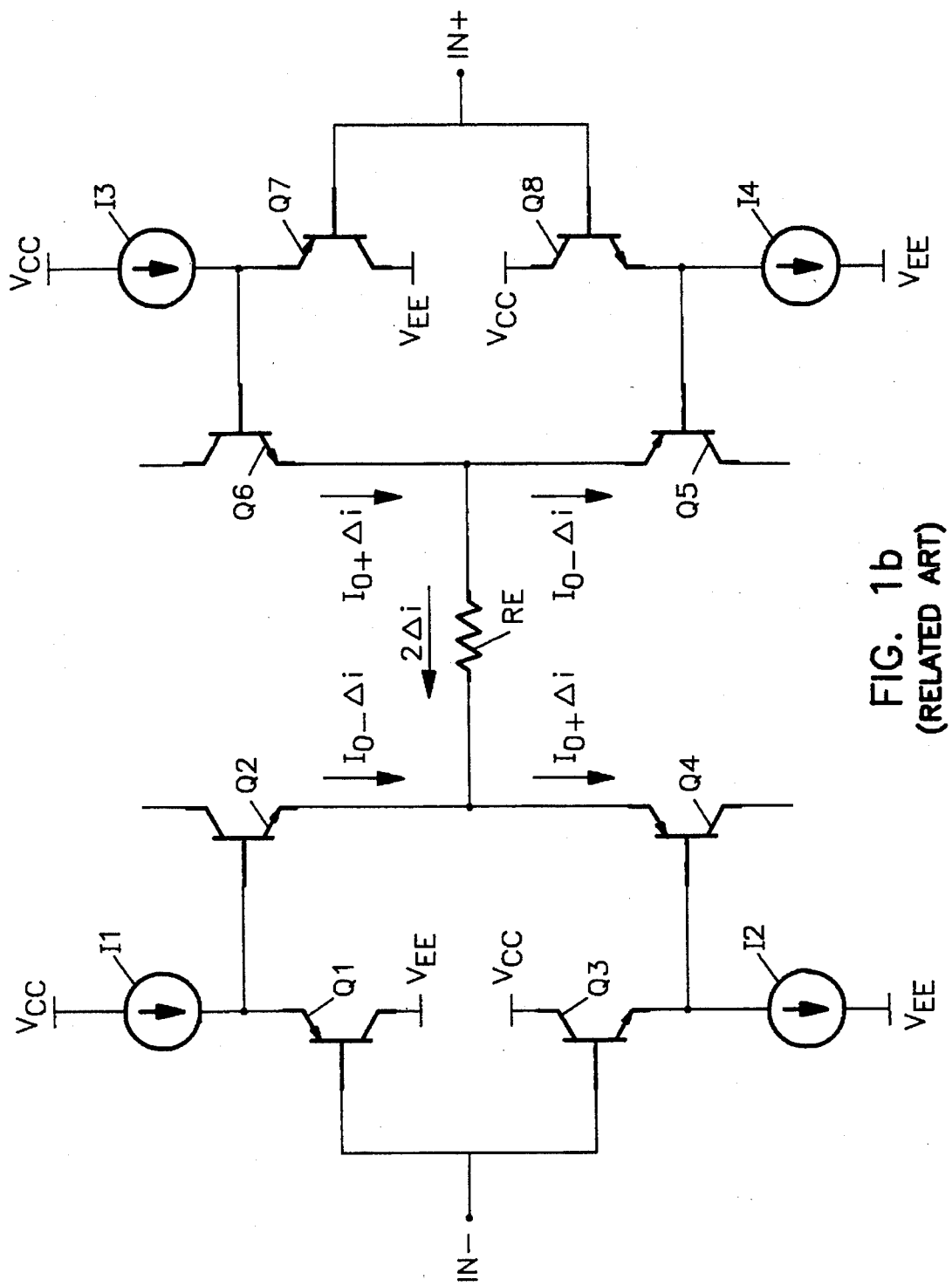
FIG. 1b shows current flows for the input buffer of the amplifier of FIG. 1b.
Figure 2:
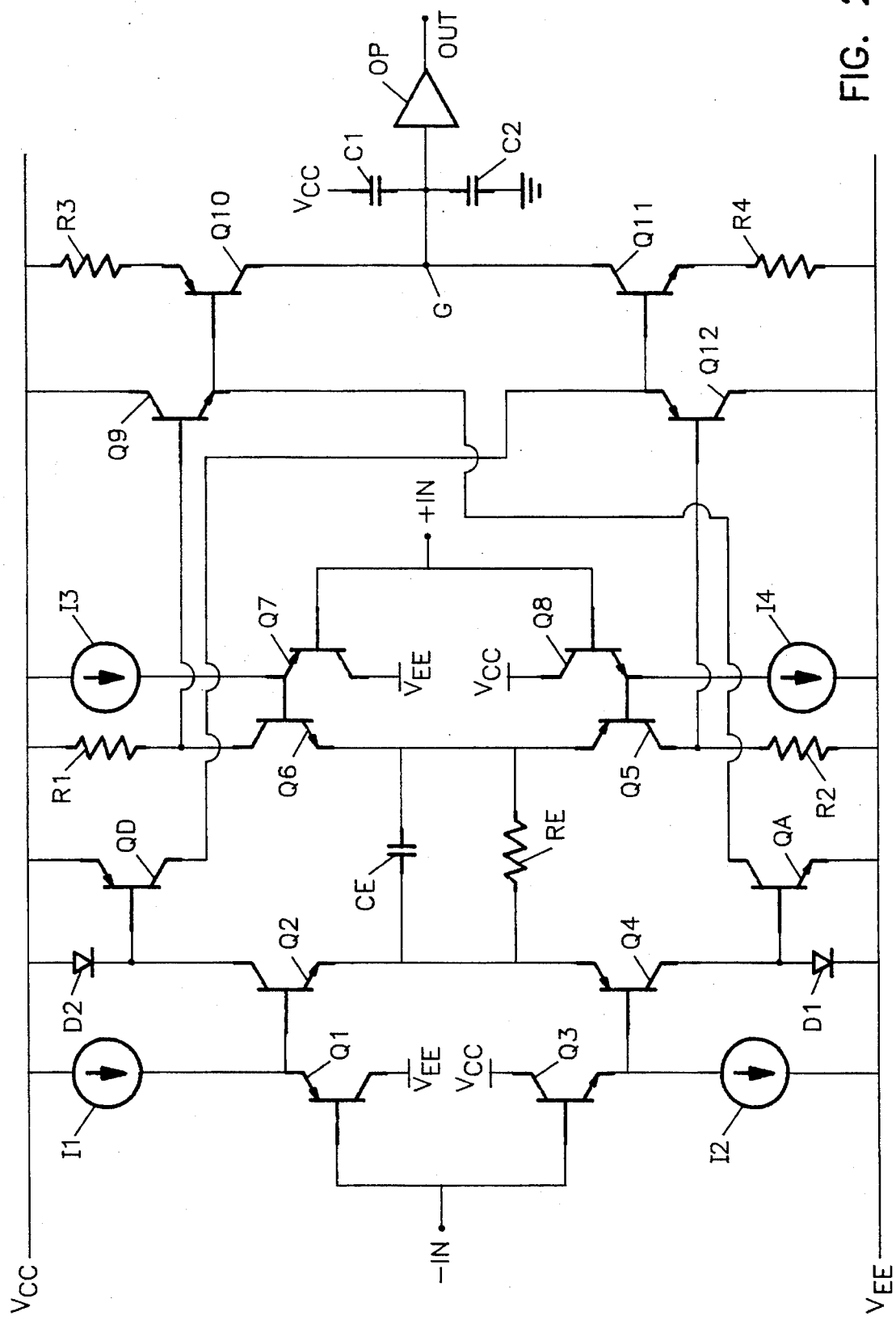
FIG. 2 shows an amplifier in accordance with the invention including dynamic current sources.

FIG. 2 shows an amplifier input stage in accordance with the present invention. This amplifier input stage is identical to that of FIG. 1 except that constant current sources I5 and I6 of FIG. 1 are not present; instead, connected to the emitter of each of transistors Q9 and Q12 (and hence also to the bases of transistors Q10 and Q11) there is a dynamic current source which includes respectively diode D1 and transistor QA, and diode D2 and transistor QD. The collector of transistor QA is connected to the emitter of transistor Q9, while the base of transistor QA is connected to one terminal of diode D1.

Similarly, the collector of transistor QD is connected to the emitter of transistor Q12 and the base of transistor QD is connected to one terminal of diode D2. The other terminals of diodes D1 and D2 are connected respectively to the positive voltage supply $V_{cc}$ and the negative voltage supply $V_{ee}$. Thus diode D2 and transistor QD are a simple current mirror, as are diode D1 and transistor QA, respectively providing current at the emitter terminals of transistors Q9 and Q12, i.e. at the base terminals of respectively transistors Q10 and Q11.

In one embodiment, diodes D2 and D1 are each conventionally a transistor having its emitter connected respectively to the voltage supply $V_{cc}$ and $V_{ee}$ and its base and collector connected together and also connected respectively to the collectors of transistors Q2 and Q4.

The additional current provided to the emitter terminals of transistors Q9 and Q12 helps discharge the parasitic capacitance as those nodes discharge faster. The (same) additional current provided to the bases of transistors Q10 and Q11 provides additional drive so as to increase current at node G to charge the capacitance at node G.

Thus an amplifier as shown in FIG. 2 solves the above-described problem of lack of current at the emitter nodes of transistors Q9 and Q12, because the charging and discharging current for the capacitances present at the emitter nodes of Q9 and Q12 is accomplished by a dynamic current supply. This advantageously increases the slew rate by providing sufficient current even during high slew rate input signals. At the same time, the quiescent current (i.e., when the input signal is not slewing) supplied by these two current mirrors is minimal.

While the input amplifier stage of FIG. 2 is a class AB amplifier, it is to be appreciated that in accordance with the invention a dynamic current source may be provided for other types of amplifiers, such as a class B amplifier. An amplifier as shown in FIG. 2 advantageously is as responsive to a high slew rate input signal as is the amplifier of FIG. 1a, while consuming only one third to one half as much quiescent current.

It should also be understood that while the amplifier of FIG. 2 is a bipolar transistor amplifier, that in accordance with the invention an amplifier using FET transistors would also be suitable with suitable modifications as are readily understood by one of ordinary skill in the art. In a typical application the amplifier of FIG. 2 is an operational amplifier (op amp).

It is also to be understood that while the amplifier of FIG. 2 uses conventional current mirrors, one may substitute e.g. Wilson current mirrors or modified Wilson current mirrors or other types of current mirrors. One suitable and well known current mirror includes two transistors having their control (base) terminals connected together, where the first current handling terminal of each transistor is connected to a voltage supply. The second current handling terminal of the first transistor is connected to an input current and this second current handling terminal is also connected to the control terminals of both transistors. Then the output current, which is seen at the second current handling terminal of the second transistor, mirrors the input current i.e. is proportional to the input current depending on the relative size of the two transistors.

Figure 3A:
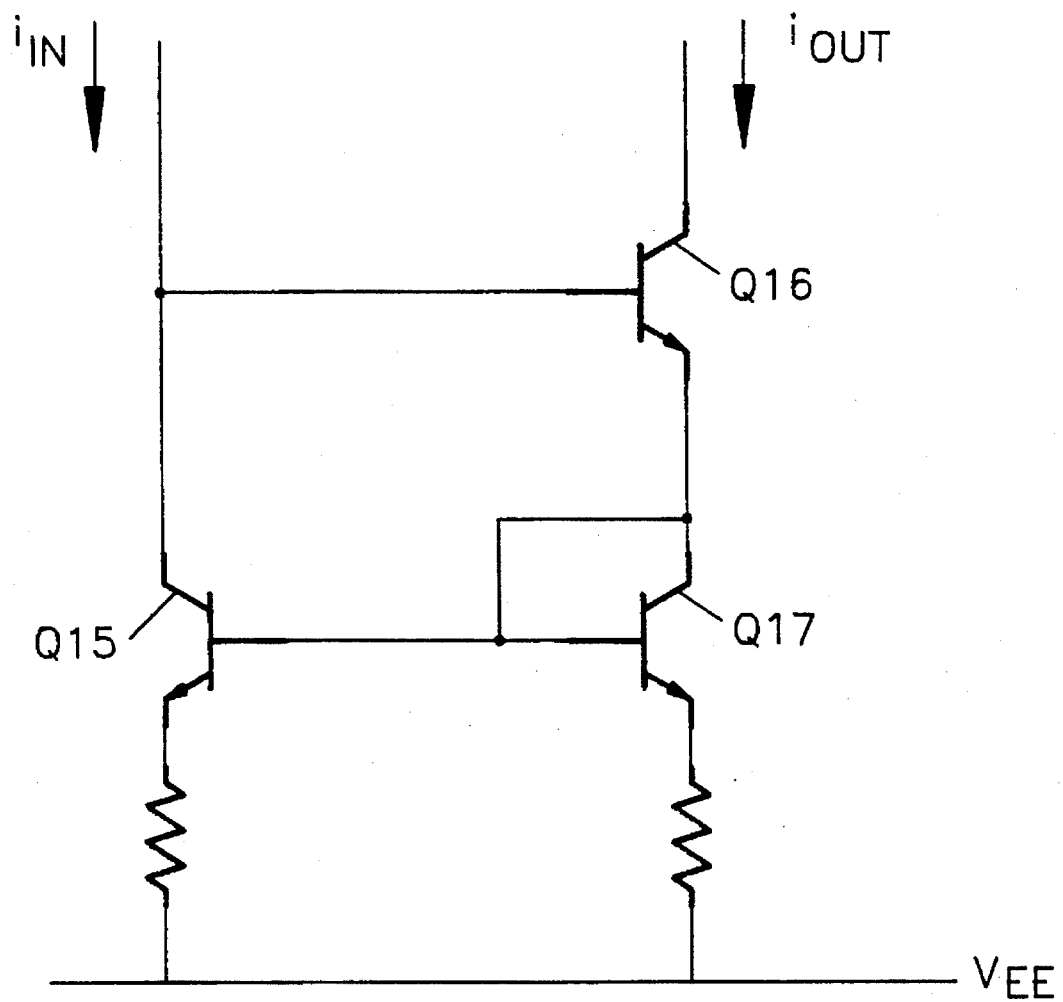
FIGS. 3a and 3b show alternative current mirrors in accordance with the invention.

Another suitable and well known current mirror is the Wilson current mirror shown in FIG. 3a including transistors Q15 and Q17 having their base terminals connected together and their emitter (first current handling) terminals connected to e.g. voltage supply $V_{ee}$. The input current $i_{in}$ which is to be mirrored is connected to the collector (second current handling) terminal of transistor Q15 and an output current $i_{out}$ is then seen at the collector terminal of a third transistor Q16. This current mirror is used in the amplifier of FIG. 2 in place of transistor QA by connecting the collector terminal of transistor Q15 to the collector terminal of transistor Q4, and the collector terminal of transistor Q16 to the emitter terminal of transistor Q9 for the upper side current mirror. Similarly, a lower side Wilson current mirror would be substituted for transistor QD in FIG. 2. For these Wilson current mirrors, diodes D1 and D2 are not needed.

Figure 3B:
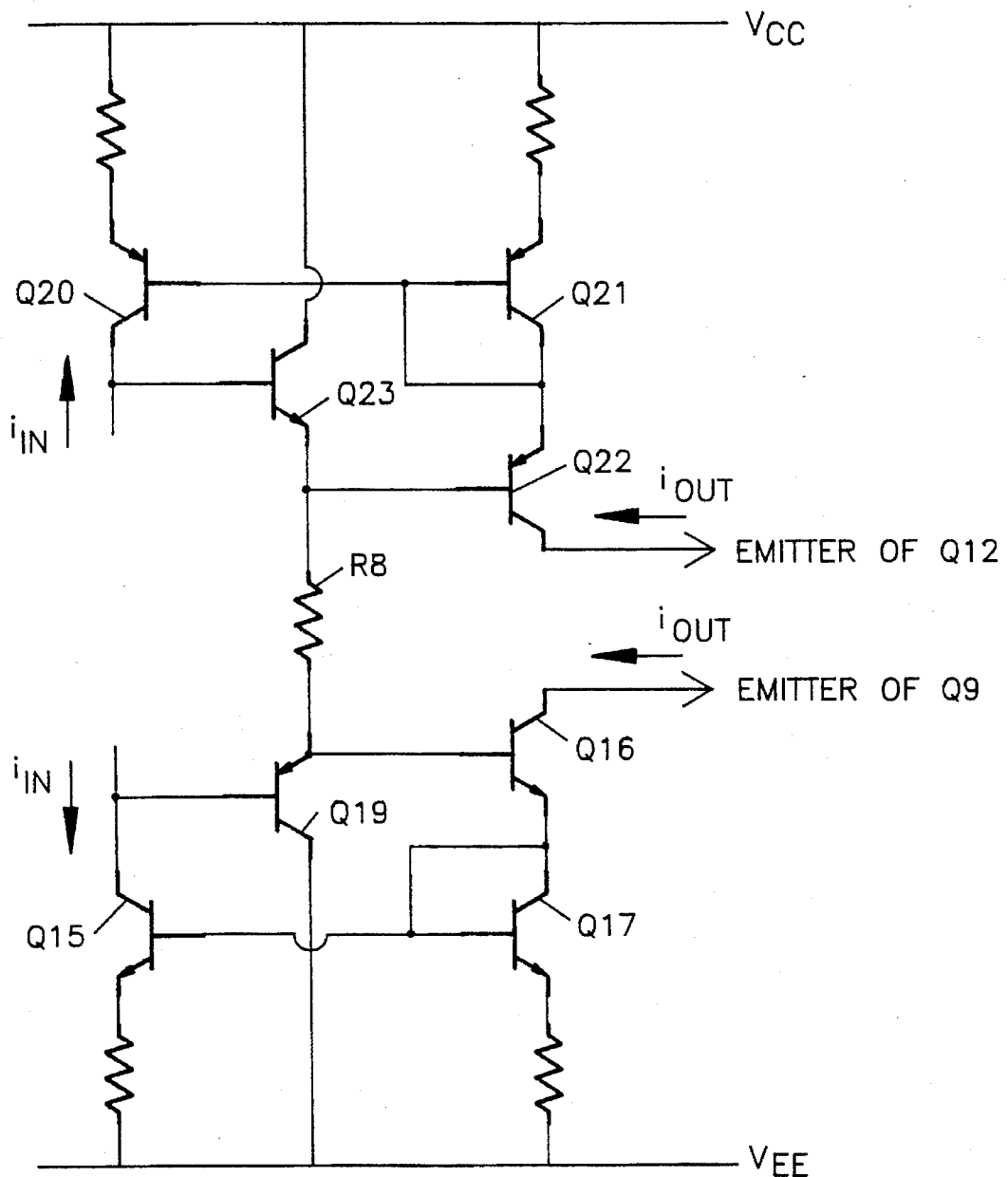

Another type of current mirror suitable for use in accordance with the present invention is shown in FIG. 3b. This is a modified Wilson current mirror (shown in the lower portion of FIG. 3b) with the additional transistor Q19. This is used similarly to the Wilson current mirror of FIG. 3a, except that the collector terminal of transistor Q19 is connected to $V_{ee}$. The base terminal of transistor Q16 is also connected via a large resistance R8 to a corresponding upper side modified Wilson current mirror including transistors Q20, Q21, Q22, and Q23.

Figure 4:
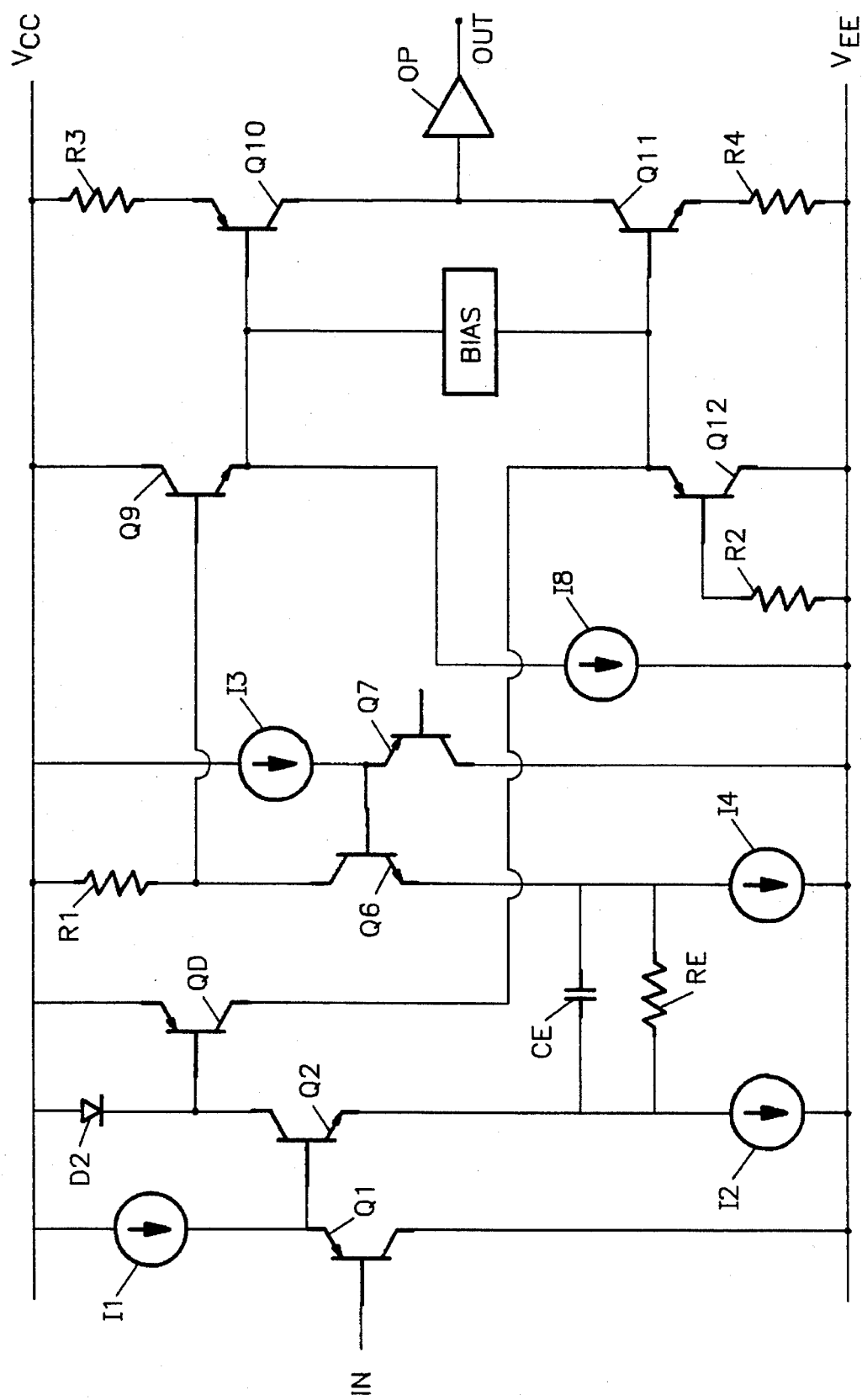
FIG. 4 shows an amplifier in accordance with a second embodiment of the invention.

FIG. 4 illustrates for a second embodiment of the present invention a differential input stage for an amplifier, i.e. a non-symmetrical input stage. Most of the elements are similar to those of FIG. 2, except that the current source including diode D1 and transistor QA is omitted. Instead a constant current source I8 sinks current from transistor Q9 in the absence of diode D1 and transistor QA. A bias voltage network connects the bases of transistors Q10 and Q11. Also, the elements which in FIG. 2 are the bottom side of the input stage are omitted because this is a differential input stage.

Figure 5:
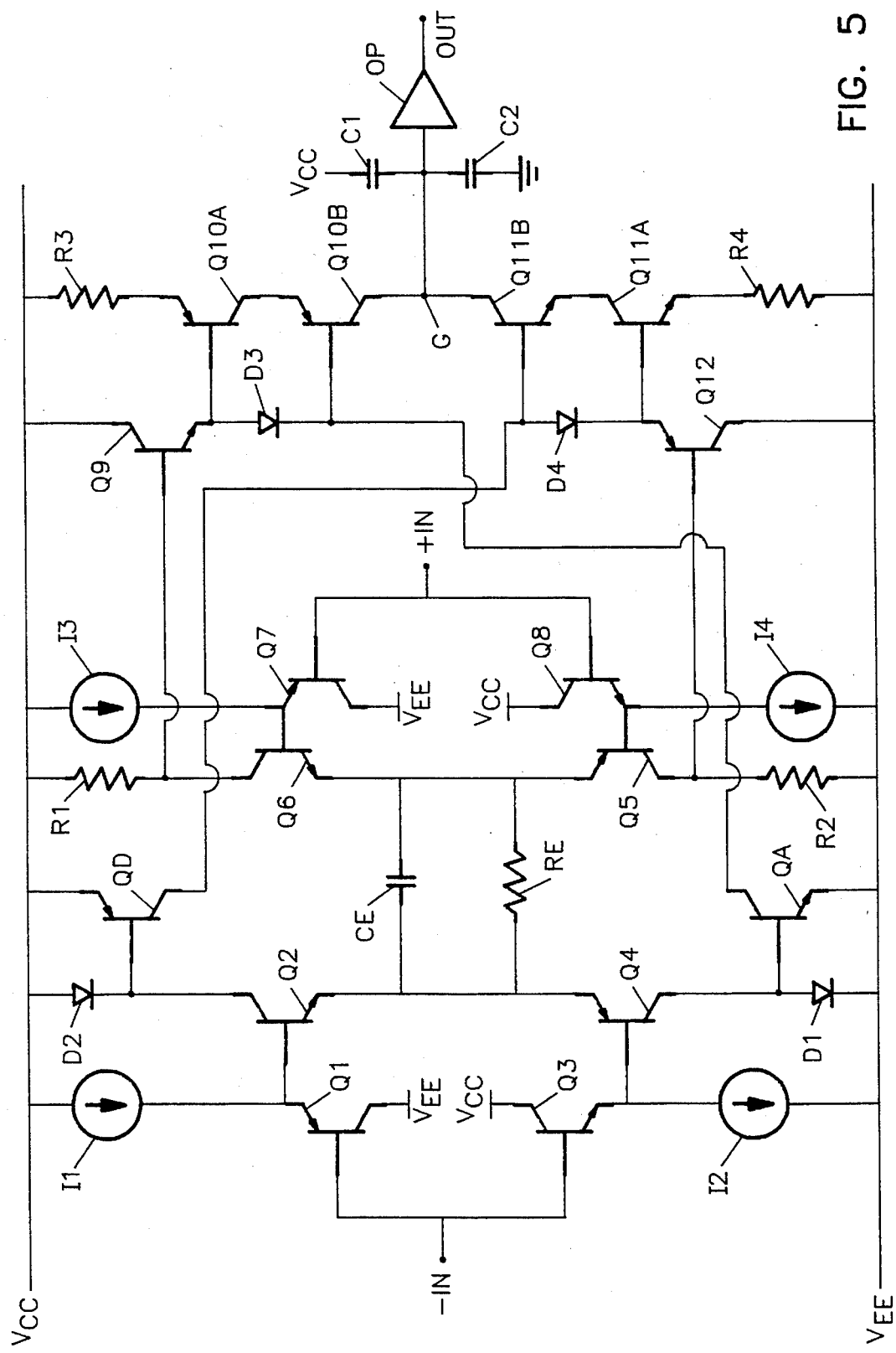
FIG. 5 shows an amplifier as in FIG. 2 using current mirrors to increase output impedance.

FIG. 5 illustrates an amplifier input stage similar to that of FIG. 2 except that transistors Q10 and Q11 are replaced by respectively transistors Q10A, Q10B and diode D3, and by transistors Q11A, Q11B and diode D4. The circuit including transistors Q11A, Q11B and diode D4 (and Q10A, Q10B, D3) is an improved version of a cascoded current mirror in which transistor Q11A is buffered by transistor Q11B. In this current mirror, the base terminal of transistor Q11A is at the same potential as its collector terminal (which is connected to the emitter terminal of transistor Q11B). Use of these current mirrors advantageously increases the output impedance of the input stage at node G by a factor of β of transistor Q11B (or transistor Q10B).

Other current sources which provide a dynamic (variable) level of current output may also be substituted for transistors QA and QD in FIGS. 2 and 4. The examples herein are merely illustrative of types of dynamic current sources.

Also, advantageously the current being used to set the current level of the current mirrors and also to dynamically adjust the current level output of the current mirrors is current which even in the circuit for instance of FIG. 1a is being consumed, i.e. the current at the collectors of respectively transistors Q2 and Q4. Thus driving the current mirrors in accordance with the invention consumes no extra current.

Connecting the collectors of Q2 and Q4 via diodes D2, D1 in FIG. 2 to their respective voltage sources prevents any limitation of the output signal level. Thus it is to be understood that in accordance with another embodiment of the invention diodes D1 and D2 of FIGS. 2 and 4 may be omitted at the disadvantage of somewhat limiting the output signal level.

It is to be appreciated that the amplifier input stage in accordance with the present invention is usable with any type of amplifier output stage, as illustrated in FIGS. 2 and 4 by the generalized output stage OP.

This disclosure is descriptive but not limiting; further modifications will be apparent to one skilled in the art in the light of this disclosure and are intended to fall within the scope of the appended claims.

We claim:

1. An amplifier comprising:

an input buffer;

a first gain stage having at least one transistor and being driven by the input buffer;

a second gain stage connected to said first gain stage, said second gain stage including a current mirror, said current mirror including a first transistor having a first current handling terminal connected to a voltage supply and a second current handling terminal connected to a second current handling terminal of a second transistor, said second transistor having a first current handling terminal connected to an output node of said second gain stage, and a diode connected between control terminals of respectively the first transistor and the second transistor whereby said current mirror is a cascode current mirror; and a dynamic current source having an output terminal connected to a control terminal of the second transistor in the second gain stage.

2. The amplifier of claim 1, wherein the dynamic current source is a current mirror.

3. The amplifier of claim 2, wherein the current mirror is a Wilson current mirror.

4. The amplifier of claim 2, wherein the current mirror is a modified Wilson current mirror.

5. The amplifier of claim 1, wherein the dynamic current source has a control terminal connected to an output terminal of the input buffer.

6. The amplifier of claim 1, wherein the dynamic current source includes a transistor, the control terminal of which is the control terminal of the dynamic current source, and a first current handling terminal which is connected to a voltage supply, and a second current handling terminal which is the output terminal of the dynamic current source.

7. The amplifier of claim 6, the dynamic current source further comprising a diode connected between the voltage source and the control terminal of the dynamic current source transistor.

8. The amplifier of claim 1, wherein the dynamic current source provides a current that is related to a strength of a signal output by the input stage.

9. An amplifier comprising:

an input buffer;

a gain stage having at least one transistor and being driven by the input buffer;

said gain stage including a current mirror, said current mirror including a first transistor having a first current handling terminal connected to a voltage supply and a second current handling terminal connected to a second current handling terminal of a second transistor, said second transistor having a first current handling terminal connected to an output node of said gain stage and including a diode connected between the control terminals of respectively the first transistor and the second transistor whereby said current mirror is a cascode current mirror; and a dynamic current source having an output terminal connected to a control terminal of the second transistor in the gain stage.

10. An amplifier having an input node and an output node, comprising:

an input buffer coupled to said input node;

a first gain stage having a transistor and being driven by the input buffer;

a second gain stage comprising a first transistor, a second transistor and a diode, said first transistor having an emitter terminal, a base terminal, and a collector terminal, said second transistor having an emitter terminal, a base terminal, and a collector terminal, said diode having a first terminal and a second terminal, said emitter terminal of said first transistor being coupled to a voltage supply, said collector terminal of said first transistor being coupled to said emitter terminal of said second transistor, said collector terminal of said second transistor being coupled to an output node of said second gain stage, said first terminal of said diode being coupled to said base terminal of said first transistor, said second terminal of said diode being coupled to said base terminal of said second transistor; and a dynamic current source having an output terminal coupled to said base terminal of said second transistor of said second gain stage.

11. A method of operating an amplifier having an input buffer, a first gain stage driven by the input buffer, and a second gain stage driven by the first gain stage, comprising the steps of:

providing a current to drive each of the gain stages;

dynamically adjusting an amount of the provided current; and operating the second gain stage as a cascode current mirror to provide increased output impedance at an output node of the second gain stage and to mirror a current output of the first gain stage.

\* \* \* \* \*